United States Patent [19]

Hayashi et al.

[11] 4,270,096
[45] May 26, 1981

[54] SEMICONDUCTOR LASER DEVICE

[75] Inventors: Izuo Hayashi; Takao Furruse, both of Tokyo, Japan

[73] Assignee: Nippon Electric Co., Ltd., Tokyo, Japan

[21] Appl. No.: 38,963

[22] Filed: May 14, 1979

[30] Foreign Application Priority Data

May 12, 1978 [JP] Japan .................................. 53-56781

[51] Int. Cl.³ .............................................. H01S 3/19
[52] U.S. Cl. ............................................. 331/94.5 H
[58] Field of Search ..................... 331/94.5 H, 94.5 C; 357/18, 17

[56] References Cited

U.S. PATENT DOCUMENTS 3,363,195  1/1968  Furnanage et al. ............ 331/94.5 H

OTHER PUBLICATIONS

K. Itoh et al., "Embedded-Stripe GaAs-GaAlAs Double-Heterostructure Lasers with Polycrystalline GaAsP Layers-II: Lasers with Etched Mirrors", IEEE Journal of Quantum Electronics, vol. QE-13, No. 8, Aug. 1977, pp. 628-631.

Primary Examiner—James W. Davie
Attorney, Agent, or Firm—Sughrue, Rothwell, Mion, Zinn and Macpeak

[57] ABSTRACT

In a stripe geometry buried double heterostructure semiconductor laser device, a first semiconductor layer for effecting laser oscillation upon injection of carriers is sandwiched between second and third semiconductor layers having a wider band gap than the first semiconductor layer. This double heterostructure is partially rendered mesashaped to provide a stripe geometry, and the vacancy resulting from mesa formation is filled with a fourth semiconductor layer having a wider band gap than the first semiconductor layer. In this invention, the region of the first semiconductor layer which is spaced from both end facets of the device by a distance at least equal to the diffusion length of carriers has a narrower band gap that the other regions of the first semiconductor layer.

5 Claims, 8 Drawing Figures

SEMICONDUCTOR LASER DEVICE

BACKGROUND OF THE INVENTION

This invention relates to a semiconductor laser device and more particularly to a stripe geometry buried double heterojunction structure semiconductor laser and its manufacturing method.

One advantage of what is conventionally referred to as a stripe-geometry buried double-hetero junction structure semiconductor laser is that, even with a small stripe width (1 to 2 $\mu$m), it confines carriers and light as effectively in a direction parallel to the hetero junction interface as in a direction vertical to the heterojunction interface.

Therefore the expansion of the oscillation region is nearly equal in a direction either parallel or vertical to the junction interface, thereby achieving a point-like laser emission pattern at the output facets wherein laser beams are radiated substantially symmetrically with respect to the direction of the light propagation. Such a point laser beam can be focused by a conventional convex lens to a point with a size of its wavelength, and therefore it is suitable for use as the light source for video disks and optical fiber communications. Using a similar convex lens, the beam can also easily be converted into parallel beams forming a circular cross section, thus replacing a gas laser for potential use in many applications. However, since a buried heterostructure semiconductor laser as a point light source has transverse mode width as small as 1 $\mu$m, such laser, especially one of GaAs/AlGaAs system, owing to the well known effect of catastrophic optical damage on mirrors, has its oscillation output limited to about 1 mW when oscillated continuously at room temperature, with the result that it can be used in only a very limited field of applications. In addition, the conventional buried heterostructure of GaAs/AlGaAs system has been manufactured by first forming a double heterojunction structure through a liquid phase epitaxial growth from a Ga solution, then removing the structure out of the growth boat for performing mesa etching, and thereafter performing the second liquid phase epitaxy. The second crystal growth occurs in the presence of a semiconductor whose surface has been oxidized with atmosphere after mesa etching, and therefore, defects will easily develop at the interface between the layer of the first grown semiconductor and that of the next grown semiconductor, thus providing a semiconductor device of short life time and low reliability. What is more, the second liquid phase growth has been a bottleneck in large-scale production because it requires a sophisticated technique so that a very tiny 1 $\mu$m wide flat-topped mountain or "mesa" produced by mesa etching is not lost by meltback.

SUMMARY OF THE INVENTION

It is therefore an object of this invention to provide a semiconductor laser device which retains the features of a buried heterostructure laser as a point light source and yet exhibits high reliability, delivers a very high output power and is easy to manufacture.

It is another object of this invention to provide a method of producing such semiconductor laser device.

The semiconductor laser device of this invention has a stripe geometry buried double heterostructure wherein a first semiconductor layer for performing laser oscillation is sandwiched between second and third semiconductor layers, and the first semiconductor layer within the region spaced from the end facets of the laser crystal by a distance equal to or more than the diffusion length of carriers has a bandgap narrower than that of the first semiconductor layer in the other regions.

The method of manufacturing such semiconductor laser device according to this invention comprises the steps of:

forming a double heterostructure with first, second and third semiconductor layers on a semiconductor substrate;

making a mesa construction of the double heterostructure by performing vapor phase etching on the semiconductor layers of the double heterostructure;

removing with another gas the mask used in the mesa etching;

forming through vapor phase growth a fourth semiconductor layer in the portion of the double heterostructure from which the first, second and third semiconductor layers have been selectively removed, steps of vapor phase etching, mask removal and vapor phase growth being continuously performed in the same apparatus without contact with outer atmosphere;

introducing an impurity into part of the first semiconductor layer to make the bandgap thereof narrower than that of the other parts of the same semiconductor layer;

forming electrodes; and forming the end facets of a laser cavity.

DESCRIPTION OF THE PREFERRED EMBODIMENTS

The first preferred embodiment of this invention will hereunder be described in conjunction with a semiconductor laser device of GaAs/AlGaAs system.

Figure 1:
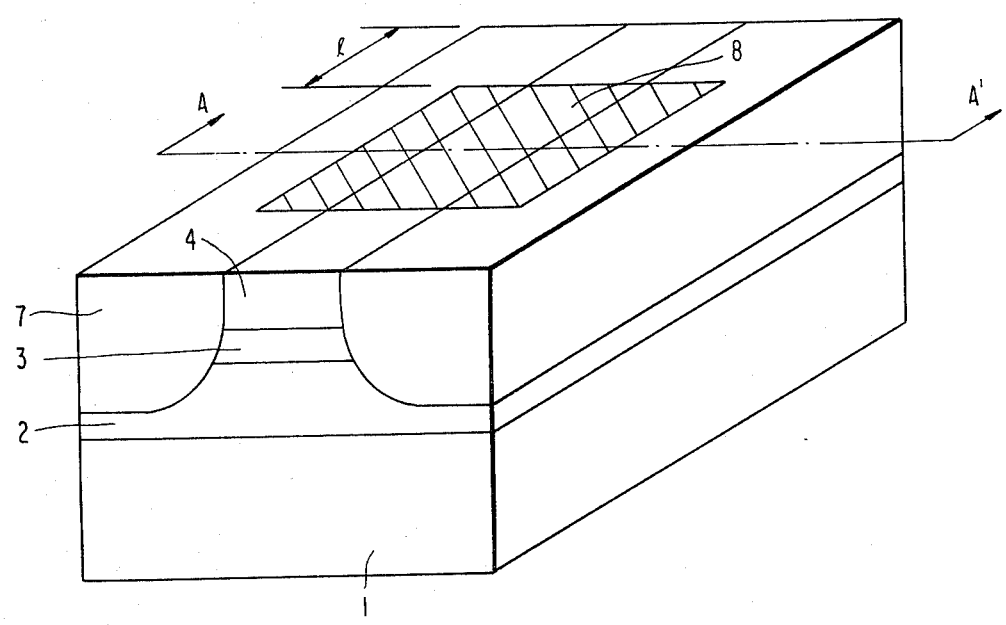
FIG. 1 is a perspective view of a semiconductor laser device according to a first embodiment of this invention.
Figure 2A:
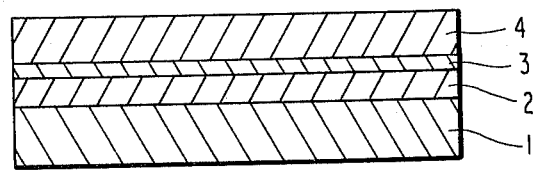
FIGS. 2A, 2B, 2C and 2D are sectional views illustrating major steps of manufacturing the semiconductor laser device of FIG. 1, with each Figure taken on the line A-A' of FIG. 1.
Figure 2B:
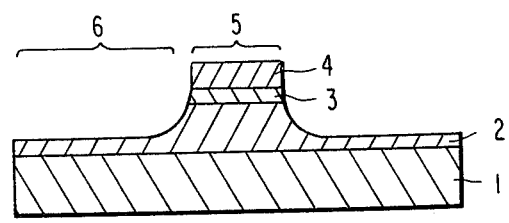
Figure 2C:
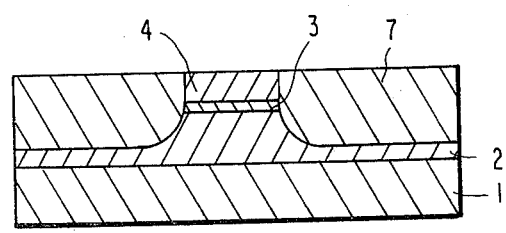
Figure 2D:
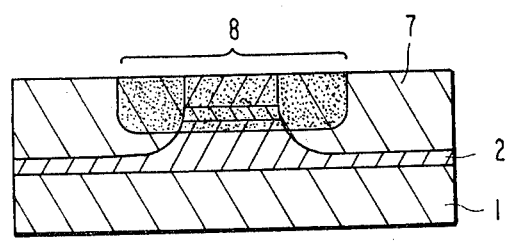
Figure 3:
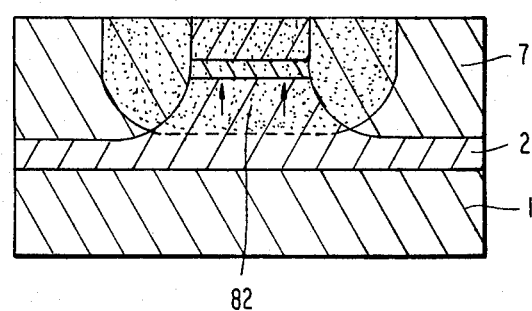
FIG. 3 and FIG. 4 are sectional views illustrating modifications of FIG. 2D wherein other Zn-doping methods are utilized.
Figure 4:
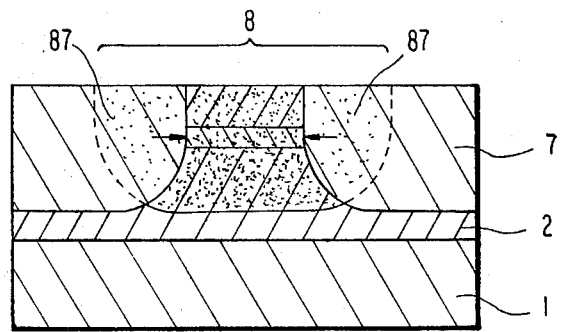

Referring first to FIG. 2A, on an N-type GaAs substrate 1 are sequentially formed by liquid phase or vapor phase epitaxial growth an N-type $Al_{0.3}Ga_{0.7}As$ layer 2 a few microns thick (a second semiconductor layer), an N-type GaAs layer 3 which is 0.1 to 0.3 $\mu$m thick and contains an impurity of at least 1 to $2 \times 10^{18}$ cm$^{-3}$ (a first semiconductor layer), and an N-type $Al_{0.3}Ga_{0.7}As$ layer 4 which is 1 to 2 $\mu$m thick (a third semiconductor layer). Then, using a photoresist mask pattern having a stripe width of 1 to 2 $\mu$m, the semiconductor element of double heterostructure of FIG. 2A is placed in a specially designed vapor phase reactor where unwanted portions of the element are etched away by use of hydrochloric acid (HCl) to form a mesa stripe 5 (see FIG. 2B). To be more specific, a mixture of hydrogen carrier gas and 0.01% HCl gas at 600° C. is used to mesa etch the double heterostructure layers to a depth of 3 μm leaving the masked portion intact. Subsequently, the reactor is placed under vacuum, charged with carbon fluoride ($CF_4$) gas at 0.1 Torr and excited by high frequency discharge to remove the mask. The reactor is then charged with hydrogen ($H_2$) gas containing about 0.1% of a suitable mixture of gallium hydrocarbon [$Ga(CH_3)_3$] and aluminium hydrocarbon [$Al(CH_3)_3$] and about 1% of arsenide hydride ($AsH_3$), and the substrate is heated to 600° C., with the result that an AlGaAs layer 7 (a fourth semiconductor layer) grows outside the "mesa" to complete a buried double heterostructure (see FIG. 2C). The heterostructure is recovered from the vapor phase reactor, and zinc (Zn) is selectively diffused from the side of the third semiconductor layer 4 into a region spaced by at least the diffusion length of carriers, from the locations which will serve as the end facets of a semiconductor laser device and including the stripe 5 to form a Zn-diffused region 8 (see FIG. 1 and FIG. 2D). The diffused Zn is deep enough to pass through the GaAs layer 3 (the first semiconductor layer) and reach the second semiconductor layer 2. To reduce the band gap through the compensatory effect of the P- and N-type impurities, it is necessary that the concentration of Zn in the first layer 3 of GaAs be at least equal to 1 to $2 \times 10^{18}$ cm$^{-3}$ or the concentration of N-type impurity in said layer. The higher the concentrations of N- and P-type impurities, the narrower the band gap. However, too high a concentration of N- or P-type impurity will result in low radiative or light emitting efficiency. Therefore, the concentrations of N-type impurity and the diffused Zn must be limited to not more than 2 to $3 \times 10^{18}$ cm$^{-3}$ and $1 \times 10^{19}$ cm$^{-3}$, respectively. The zinc diffusion from a zinc arsenide ($Zn_3As_2$) source held at about 600° C. uses a calibrated diffusion length versus time relationship to control the diffusion period so that the Zn concentration is held within the above specified range in the first GaAs layer 3 and so that where the second semiconductor layer 2 contacts the first GaAs layer 3, the Zn concentration in the Zn diffused region 82 in the second semiconductor layer 2 (FIG. 3) may not exceed the concentration of N-type impurity (of the order of $10^{18}$ cm$^{-3}$) in the second semiconductor layer 2. Alternatively, as is shown in FIG. 4, the diffusion may be so controlled that the Zn concentration in the Zn diffused regions 87 in the fourth semiconductor layer 7 rather than the second semiconductor layer 2 contacts the first GaAs layer 3, the Zn concentration will not exceed the concentration of N-type impurity in the fourth semiconductor layer 7. As shown in FIGS. 3 and 4, diffusion of Zn under the above specified conditions will provide a a P-N junction contiguous to the GaAs layer 3, into which electrons can be injected and thus the Zn diffused GaAs layer acts as an exciting layer.

Following these steps, TiAu is evaporatively deposited on the Zn diffused region on a wafer to form a positive electrode, whereas tin (Sn) is evaporatively deposited on the GaAs substrate 1 to form a negative electrode (neither electrode shown), and thereafter the individual semiconductor elements are separated by cleavage and other suitable means to thereby produce semiconductor laser devices.

The Zn diffused region 8 is so controlled that it is spaced from the reflective surfaces of the semiconductor laser device by a distance ranging from the diffusion length of carriers to several tens of microns (5 μm < 1 < 50 μm). Concerning the leak current, the width of the Zn diffused region 8 is desired to be restricted to the width of the mesa stripe 5. From a practical point of view, however, the width of the region 8 is so controlled that it ranges from about 10 to 50 μm, in order to facilitate the setting of opening for Zn diffusion.

While the foregoing description has assumed the use of a heavily doped N-type GaAs layer 3, it is to be understood that the first semiconductor layer 3 may be doped with a lower concentration of N-type impurity or a low concentration ($\leq 1 \times 10^{17}$ cm$^{-3}$) of P-type impurity which is slightly less effective for reducing the band gap. Furthermore, $Al_xGa_{1-x}As$ as the material for the fourth semiconductor layer 7 may effectively be replaced by a monocrystalline, polycrystalline or amorphous semiconductor such as $In_xGa_{1-x}As_yP_{1-y}$ which provides a wider band gap than the first semiconductor layer 3.

Figure 5:
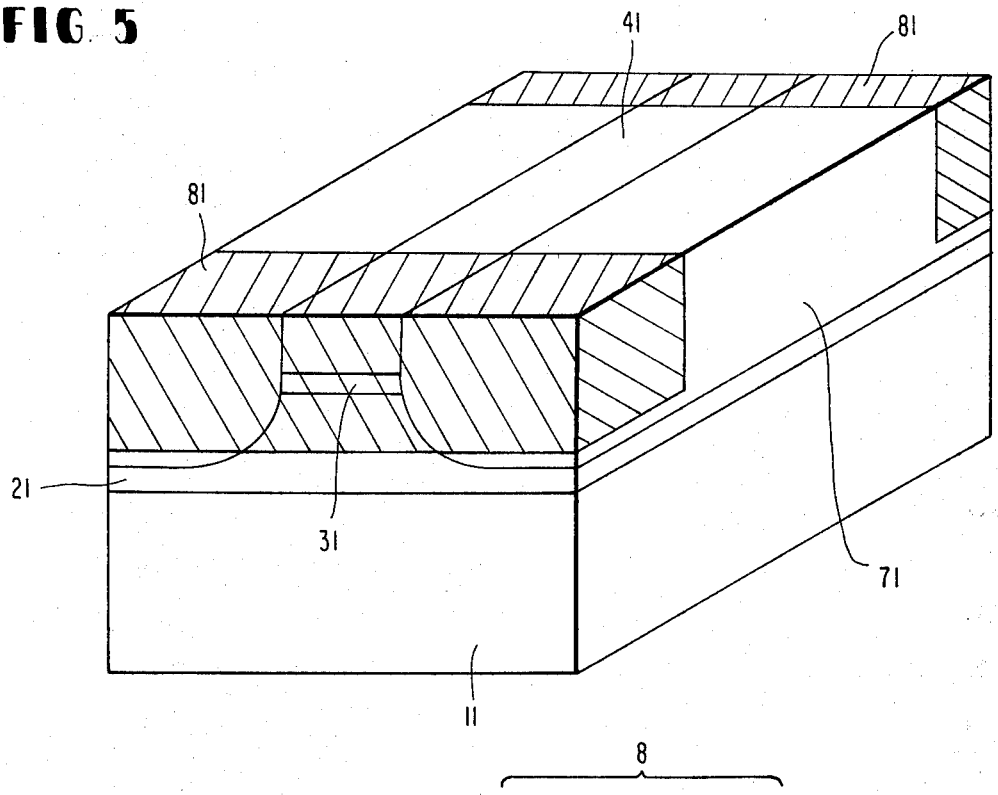
FIG. 5 is a perspective view of a semiconductor laser device according to a second embodiment of this invention.

FIG. 5 is a perspective view of the semiconductor laser device according to the second preferred embodiment of this invention. Description of the method of manufacturing this second type of semiconductor laser device is omitted because it is manufactured basically in the same manner as in the manufacture of the device according to the first preferred embodiment described hereinabove. The only differences it has from the semiconductor laser device of the first type are that (1) the second and third semiconductor layers 21 and 41 are of opposite conductivity types, and that (2) an N-type impurity sulfur (S) is diffused into the end facets of the laser crystal. To be more specific, the reference numeral 11 represents an N-type (or P-type) GaAs substrate, 21 is an N-type (or P-type if the substrate 11 is of P-type) $Al_{0.3}Ga_{0.7}As$ layer (the second semiconductor layer), 31 is a GaAs layer (the first semiconductor layer) of low impurity concentration (N or P $<1 \times 10^{17}$ cm$^{-3}$), 41 is a P-type (or N-type if the substrate is of P-type) $Al_{0.3}Ga_{0.7}$. As layer (the third semiconductor) layer, 71 is an N-type $Al_xGa_{1-x}As$ layer, and 81 is a S-diffused region. This region of GaAs layer into which sulfur has been diffused is of N-type with an impurity concentration of about 1 to $3 \times 10^{18}$ cm$^{-3}$ and it has a wider band gap than the non-diffused central region.

According to a third preferred embodiment of this invention, the semiconductor laser device has phosphor diffused throughout the region rather than sulfur as used in the second preferred embodiment. The effect achieved with the semiconductor laser device according to the third preferred embodiment is equal to that obtained with those according to the first and second preferred embodiments, since phosphor, diffusing into the buried GaAs layer, replaces part of arsenide (As) in the layer to convert it into a $GaAs_xP_{1-x}$ layer having a wider band gap.

The semiconductor laser device manufactured according to the first, second or third embodiment has a buried double heterostructure and is capable of confining light equally effectively in a direction either parallel or vertical to the junction interfaces, with the resultant laser beam providing a point light source. In addition, since part of the stripe region is doped with a high concentration of impurity, the central region of the buried first semiconductor layer that produces laser oscillation has a narrower band gap than the first semiconductor layer of the stripe near each end facet of the device, thus providing a laser oscillation wavelength longer than the wavelength of the absorption edge at the adjacent regions of the reflective surfaces. The result is a significant increase in the threshold optical power for the catastrophic damage of the reflective surfaces, which therefore leads to the manufacture of a semiconductor laser device that produces an oscillation output of 10 mW or more for a stripe width of 1 μm, a substantial improvement on the conventional type of buried heterostructure semiconductor laser device.

The dimensional tolerance for the impurity-doped region is effective for increasing the yield of the intended product. More specifically, each end of the longitudinal dimensions of the Zn-diffused region 8 is in the range of about 5 to 50 μm as measured from the reflective surfaces, whereas the allowable limits of the width of the region 8 are in the range of about 10 to 50 μm including the stripe width (a few microns). Therefore, the longitudinal or transverse dimensions of the region 8 which are offset from the center of laser but within the above specified ranges will provide a satisfactory result for the purposes of this invention. Such dimensional tolerance facilitates the forming of the reflective surfaces of a semiconductor laser device by cleavage or etching after diffusion process. As a further advantage, according to a buried heterostructure with narrow stripe width of the type described above, its reflective surfaces, like a cross section of a microwave waveguide, need not be always vertical to the direction of guiding waves, and the reflective surfaces slightly inclined from the plane vertical to the wave-guiding direction can also achieve the same result as when they are vertical to the wave-guiding direction. Therefore, the reflective surfaces forming a laser cavity can now be produced efficiently by an etching technique instead of a cleavage process, thus permitting large-scale production of a semiconductor laser device.

Also according to the process for manufacturing a semiconductor laser device of this invention, an assembly of semiconductor layers of double heterostructure is subjected to mesa etching and formation of the fourth semiconductor layer within the same apparatus without being exposed to atmosphere, and therefore, no oxidation is made of the surface of the semiconductors; thus crystal defects cannot be produced, which have been frequently observed in the conventional process. In consequence, the process of this invention can provide a semiconductor laser device of extremely high reliability. In addition, as compared with liquid phase etching and liquid phase epitaxy that have been widely used in the conventional manufacture of a semiconductor laser, vapor phase etching for mesa etching and vapor phase epitaxy for formation of the fourth semiconductor layer will allow more accurate control of microscopic dimensions, and thereby attaining higher yield of the manufactured device.

While the semiconductor laser device according to this invention has hereinabove been described in conjunction with a double heterostructure semiconductor laser of GaAs/Al$_x$Ga$_{1-x}$As system into which zinc or sulfer has been diffused, it is to be appreciated that the principle of this invention also applies to various types of double hetero-structure composed of ternary to quaternary III-V Group semiconductor compounds such as a double heterostructure semiconductor laser of In$_x$Ga$_{1-x}$As$_y$P$_{1-y}$/InP system providing an oscillation wavelength of 1.0 to 1.7 μm or a laser of GaAs$_y$P$_{1-y}$/In$_x$Ga$_{1-x}$AsP$_{1-y}$ system providing an oscillation wavelength of about 0.7 μm.

While zinc, sulfur and phosphor have been exemplified as an impurity to be used for diffusion in the illustrated preferred embodiments of this invention, it is to be noted that examples of the suitable impurity element may include but are not limited to elements of Group II of the Periodic Table such as beryllium (Be) and cadmium (Cd) which diffuse at a fast rate and can be employed as a P-type impurity, as well as selenium (Se) and tellurium (Te) and other elements of VI Group which may be employed as an N-type impurity.

While the heterostructure semiconductor laser device of this invention provides the most effective point light source if its stripe width ranges from 1 to 3 μm or it oscillates in a nearly symmetrical single fundamental transversal mode, it can also be used with a stripe width of 3 μm or more if oscillation in a plurality of higher-order transversal modes is permitted. Even in the latter case, the semiconductor laser device of this invention can produce higher output than a semiconductor laser of conventional type, for instance a power output of about 100 mW, if it is made of GaAs/AlGaAs double heterostructure with a stripe width of 10 μm.

It is to be understood that while a diffusion process is used to dope the region 8 with impurities in FIGS. 1 through 5, ion implantation and other suitable methods may of course be employed effectively.

The preferred embodiments have been illustrated hereinabove based on the assumption that the fourth semiconductor layer is formed by chemical vapor deposition (CVD) or other suitable methods of vapor phase expitaxial growth. However, according to the process of this invention, the fourth semiconductor layer need not necessarily be composed of an epitaxial single crystal, and instead, it may of course be formed of amorphous or polycrystalline semiinsulating semiconductor material. An amorphous or polycrystalling material used to make the fourth semiconductor layer results in improved selectivity in the dielectric constant of the layer, hence larger freedom in design of a semiconductor laser device. As a further advantage, the polycrystalling material affords a gradual absorption edge at the band gap end due to Franz-Keldysh effect, hence facilitating control of the composition of the fourth semiconductor layer in an attempt to provide a refractive index gradient for horizontal transversal mode control.

What is claimed is:

1. A semiconductor laser device comprising a semiconductor crystal having a pair of principal surfaces and optically reflective first and second side surfaces constituting an optical resonator therebetween, and a pair of electrodes, said semiconductor crystal including an active layer bounded by said first and second side surfaces and four heterojunction interfaces within said crystal, said active layer having an exciting region elongated within said crystal between said first and second side surfaces and bounded by said four heterojunction interfaces, one and the other ends of said exciting region being spaced apart from said first and second side surfaces, respectively, said pair of electrodes being provided on said pair of principal surfaces so as to supply injection current to said exciting region to emit a light, said active layer further having first and second non-exciting regions at said one and other ends of said exciting region, said first non-exciting region extending from said one end of said exciting region to said first side surface and said second non-exciting region extending from said other end of said exciting region to said second side surface, said non-exciting regions being transparent to said light emitted from said exciting region, and the band gap of said exciting region being narrower than that of said non-exciting regions.

2. In a stripe geometry buried double heterostructure semiconductor laser device comprising a heterojunction structure including a first semiconductor layer sandwiched between second and third semiconductor layers having a wider band gap than that of said first semiconductor layer and a pair of fourth semiconductor layers sandwiching side surfaces of said first semiconductor layer, said first semiconductor layer having an exciting region elongated between a pair of end facets of the device in a stripe geometry, said end facets constituting an optical resonator, one and the other ends of said exciting region being spaced apart from said end facets of the device by a distance of at least equal to the diffusion length of carriers, said first layer further having non-exciting regions located between said one end of said exciting region and one of said end facets of the device and between said other end of said exciting region and the other end of said end facets of the device, the band gap of said exciting region being narrower than those of said non-exciting region.

3. A semiconductor laser device as in claim 2, wherein said second and third semiconductor layers being of N-type conductivity, said fourth semiconductor layers being of N-type conductivity or having semiinsulating properties, said exciting region being doped with a P-type impurity from the surface of said region down to a depth covering said first semiconductor layer, at least the portions of said second semiconductor layer within the impurity doped region or the part of said fourth semiconductor layers which are contiguous to said first semiconductor layer remaining of N-type conductivity.

4. A semiconductor laser device as in claim 3, wherein said first semiconductor layer being of N-type conductivity having an impurity concentration of $1 \times 10^{18}$ cm$^{-3}$ or more, the concentration of the P-type impurity in said exciting region being equal to or higher than the concentration of the N-type impurity inherently contained in said first semiconductor layer.

5. A semiconductor laser device as in claim 2, wherein said second semiconductor layer and third semiconductor layer are of opposite conductivity types, said non-exciting regions being doped with an N-type impurity such that the band gap of said non-exciting regions are made wider than that of said exciting region.

* * * * *

UNITED STATES PATENT AND TRADEMARK OFFICE
CERTIFICATE OF CORRECTION

PATENT NO. : 4,270,096
DATED : May 26, 1981
INVENTOR(S) : Izuo Hayashi et al

It is certified that error appears in the above—identified patent and that said Letters Patent is hereby corrected as shown below:

IN THE ABSTRACT:

Line 14, change "that" to --than--.

Column 6, line 28, change "expitaxial" to --epitaxial--.

Signed and Sealed this

Twentieth Day of October 1981

[SEAL]

Attest:

GERALD J. MOSSINGHOFF

Attesting Officer  Commissioner of Patents and Trademarks